(12) United States Patent
Tsai et al.

(10) Patent No.: US 7,170,457 B2
(45) Date of Patent: Jan. 30, 2007

(54) MOBILE ELECTROMAGNETIC COMPATIBILITY (EMC) TEST LABORATORY

(75) Inventors: Yao-Ming Tsai, Taipei (TW); Orsan Huang, Taipei (TW)

(73) Assignee: Miao-Yu Chien, Nantou Hsien (TW)

( * ) Notice: Subject to any disclaimer, the term of this patent is extended or adjusted under 35 U.S.C. 154(b) by 0 days.

(21) Appl. No.: 11/001,354

(22) Filed: Dec. 2, 2004

(65) Prior Publication Data

US 2005/0253762 A1 Nov. 17, 2005

(30) Foreign Application Priority Data

May 12, 2004 (TW) ............................... 93113320 A

(51) Int. Cl.
*H01Q 17/00* (2006.01)
*G01R 29/08* (2006.01)
(52) U.S. Cl. ..................................... 343/703; 455/67.14
(58) Field of Classification Search ................ 343/703, 343/713; 342/4; 174/377, 387; 455/67.12
See application file for complete search history.

(56) References Cited

U.S. PATENT DOCUMENTS 4,949,093 A * 8/1990 Dhanjal ...................... 343/755
5,001,494 A * 3/1991 Dorman et al. ............. 343/703

* cited by examiner

*Primary Examiner*—Michael C. Wimer
(74) *Attorney, Agent, or Firm*—Posz Law Group, PLC; R. Eugene Varndell, Jr.

(57) ABSTRACT

A laboratory has a mobile housing, a testing apparatus, a shielding unit and a first/second testing set. The housing has a top, an interior space and a shielding baffle formed inside the interior space to divide the interior space into a first room and a second room having a top, four sides and a bottom. The testing apparatus is mounted inside the first room. The shielding unit is mounted inside the second room. The first testing set is mounted inside the second room and enclosed inside the shielding unit. The testing set includes a table and a receiver. The table is attached to the bottom of the second room. The receiver is separable from the table and is electrically connected to the testing apparatus in the first room. In such an arrangement, the mobile laboratory can be transported to any desired location conveniently and is versatile in use.

16 Claims, 4 Drawing Sheets

MOBILE ELECTROMAGNETIC COMPATIBILITY (EMC) TEST LABORATORY

BACKGROUND OF THE INVENTION

1. Field of the Invention

The present invention relates to a test laboratory, and more particularly to a mobile electromagnetic compatibility (EMC) test laboratory that can be moved to any desired location conveniently.

2. Description of Related Art

An electromagnetic interference test is commonly applied after electrical products or equipments have been manufactured and before they are sold. A certificate test for regulatory is processed in a laboratory, and the conventional laboratory is of course arranged in a building and is not moveable. It is troublesome and costly to transport the products or equipments when the test facilities are far from the place of manufacture.

To overcome the defects, the present invention tends to provide a mobile laboratory to mitigate or obviate the aforementioned problems.

SUMMARY OF THE INVENTION

The main objective of the invention is to provide a mobile laboratory that can be transported to any desired location conveniently. The laboratory has a mobile housing, a testing apparatus, a shielding unit and a first testing set. The housing has a top, an interior space and a shielding baffle inside the interior space. The shielding baffle creates a first room and a second room having a top, four sides and a bottom in the interior space. The testing apparatus is mounted inside the first room. The shielding unit is mounted inside the second room. The first testing set is also mounted inside the second room and enclosed inside the shielding unit. The testing set comprises a table and an antenna receiver. The table is attached to the bottom of the second room. The antenna receiver is separable from the table. The table and antenna receiver are electrically connected to the testing apparatus in the first room.

Other objects, advantages and novel features of the invention will become more apparent from the following detailed description when taken in conjunction with the accompanying drawings.

DETAILED DESCRIPTION OF PREFERRED EMBODIMENT

Figure 1:
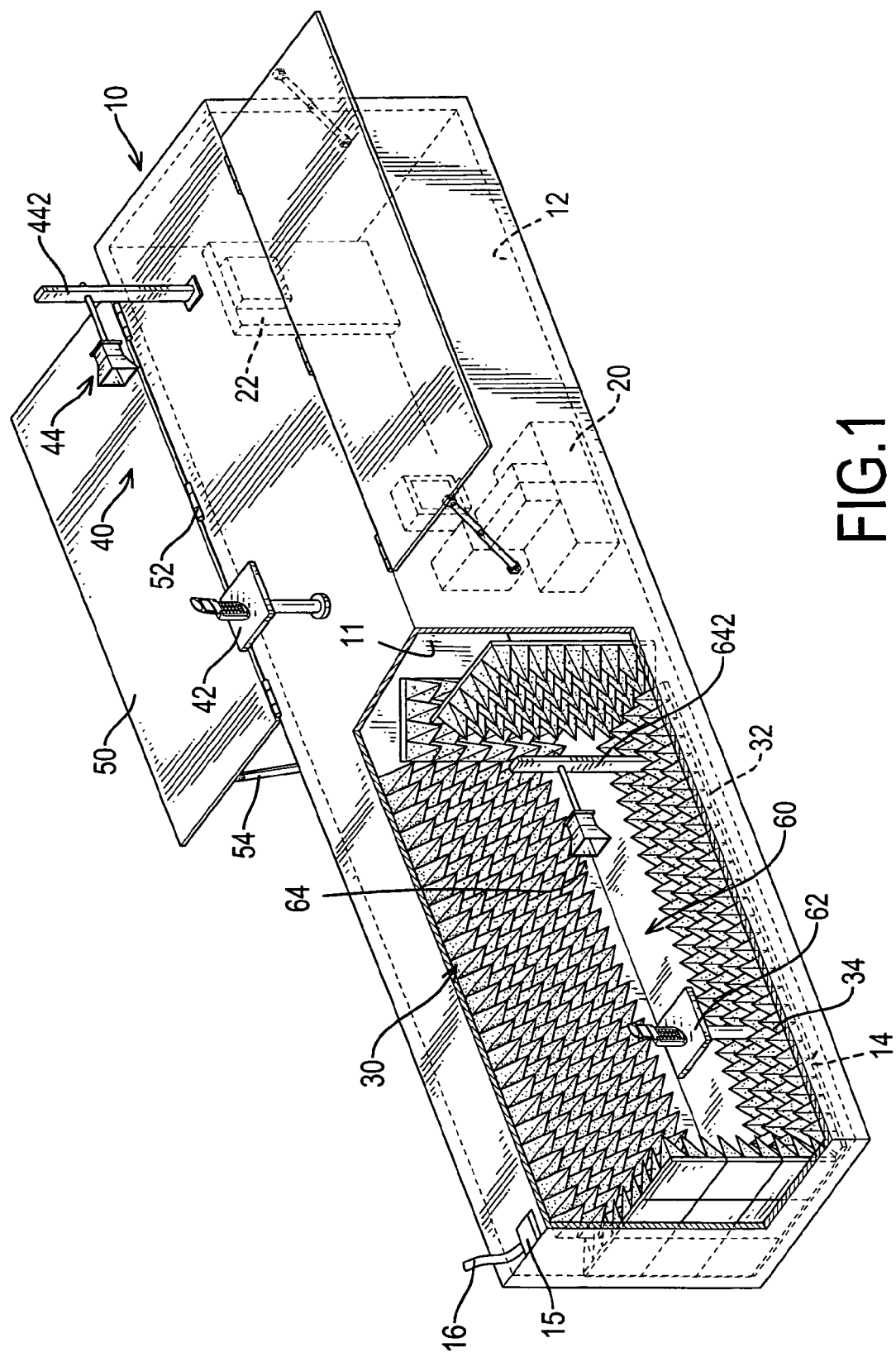
FIG. 1 is a perspective view in partial cross section of a mobile laboratory in accordance with the present invention.
Figure 3:
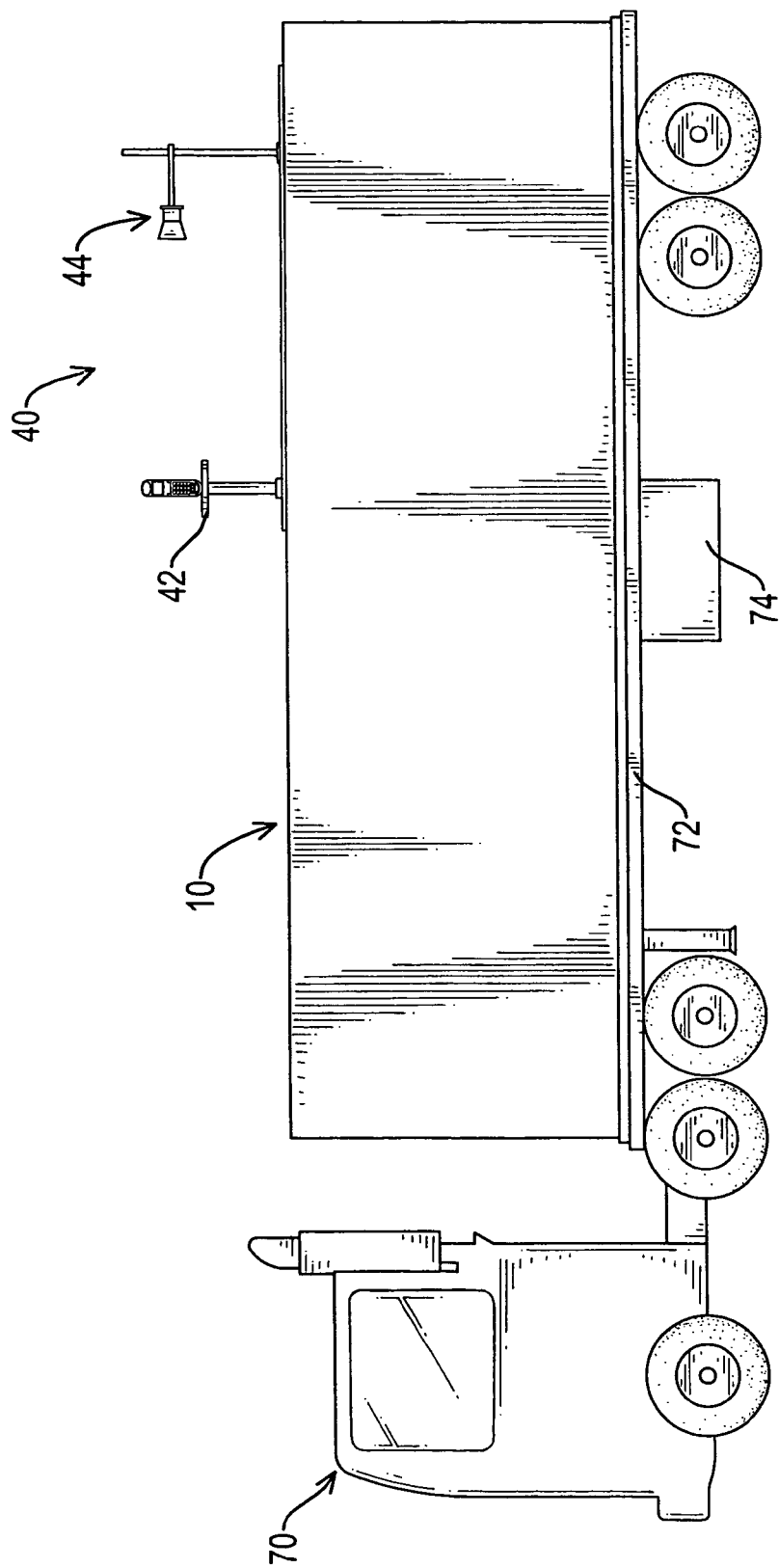
FIG. 3 is an operational side plan view of the mobile laboratory in FIG. 1 showing that the laboratory is transported with a container car.

With reference to FIG. 1, a mobile laboratory in accordance with the present invention comprises a movable housing (10), a testing apparatus (20), a shielding unit (30) and a first testing set (60). The housing (10) is mobile, can be constructed in the form of a shipping container and can be transported with a container truck (70) as shown in FIG. 3. The housing (10) has a top, an interior space and a shielding baffle (11) formed inside the inside space to divide the interior space into a first room (12) and a second room (14). The second room (14) has a top, four sides and a bottom.

The testing apparatus (20) is mounted inside the first room (12). The testing apparatus (20) can be an apparatus for an electromagnetic interference (EMI) test. In addition, an air conditioner (22) is optionally mounted inside the first room (12) to control the temperature in the first and second rooms (12,14) and to apply fresh air into the rooms (12,14).

The shielding unit (30) is mounted inside the second room (14) to keep the second room (14) from being interfered with by electromagnetic waves. In an optional embodiment, the shielding unit (30) is composed multiple foam pyramids of absorbers (34) and ferrite tile (32) attached to the top, the sides and the bottom of the second room (14).

The first testing set (60) is mounted inside the second room (14) and is enclosed inside the shielding unit (30). The first testing set (60) comprises a turn-table (62) and an antenna receiver (64). The turn-table (62) is attached to the bottom of the second room (14) to support a test device, such as a cell phone. In an optional embodiment, the turn-table (62) can be universally rotated to change the position and angle of the test device.

Figure 2:
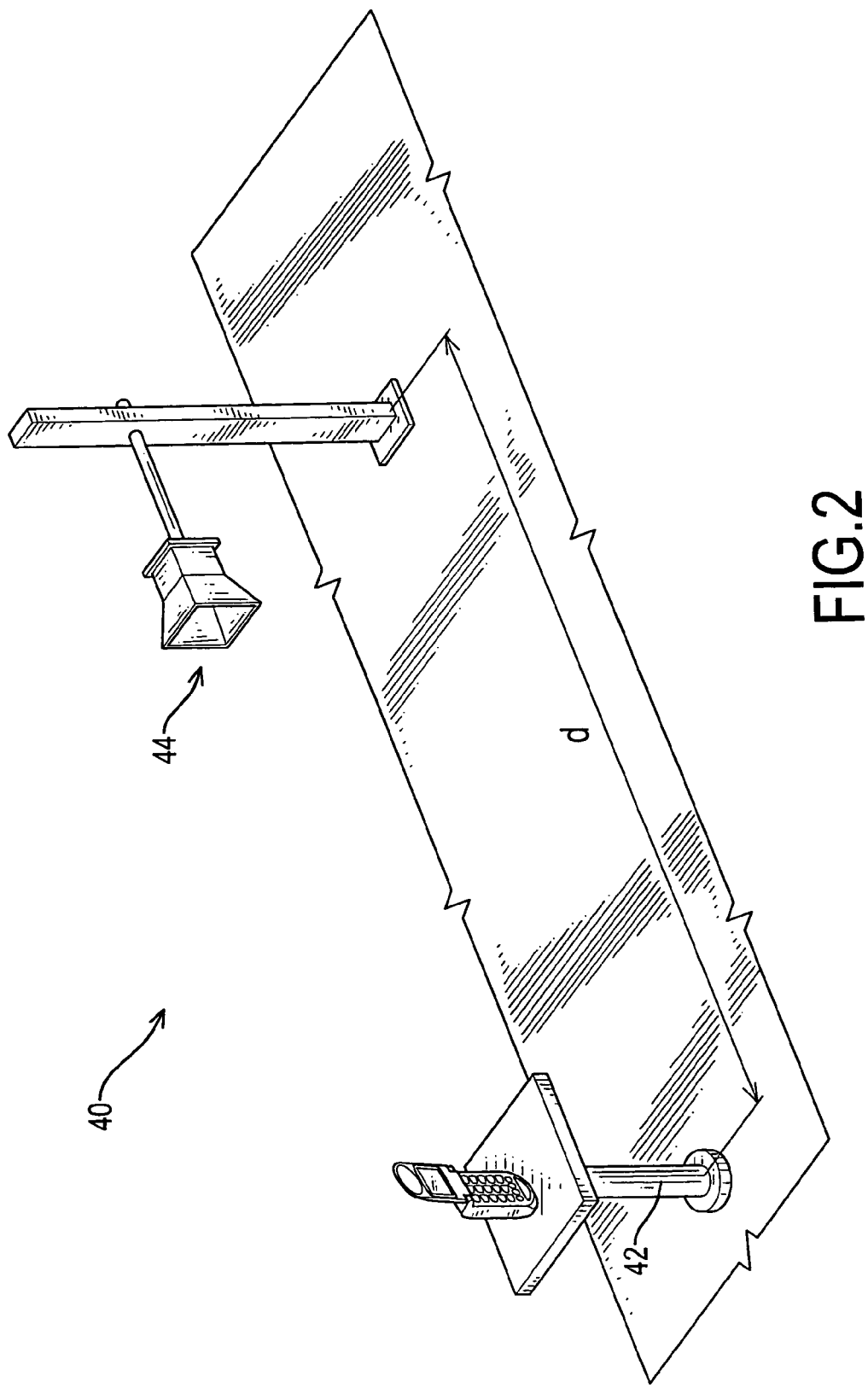
FIG. 2 is a perspective view of the testing set of the laboratory in FIG. 1.

The antenna receiver (64) is separable from the table at a distance d as shown in FIG. 2. The table and antenna receiver are electrically connected to the testing apparatus (20) in the first room (12). In an optional embodiment, an antenna tower (642) is attached to the bottom of the second room (14), and the antenna receiver (64) is attached to the antenna tower (642).

In such an arrangement, a test device, such as a cell phone can be put on the turn-table (62), and the antenna receiver (64) can receive signals emitted from the test device. With the testing apparatus (20) in the first room (14), an electromagnetic interference test is performed. With the arrangement of the shielding unit (30), interference of other electromagnetic waves at frequencies between 30 MHZ to 40 GHz is prevented.

In addition, a high frequency window (15) is formed in the housing (10) and corresponds to the second room (14), and a pipe (16) is attached to the window (15) and connected to the air conditioner (22) in the first room (12). With the window (15) and the pipe (16), the temperature in the second room (14) is controlled with the air conditioner (22), and fresh air is applied to the second room (14) through the pipe (16).

Moreover, with further reference to FIG. 2, a second testing set (40) is mounted outside the housing (10) at a location corresponding to the first room (12). The second testing set (40) can be the same as the first testing set (60) in the second room (14) and comprises a turn-table (42) and an antenna receiver (44). The turn-table (42) is attached to the top of the housing (10) to support a test device. The antenna receiver (44) is separable from the turn-table (42) at a distance (d), is electrically connected to the testing apparatus (20) in the first room (12) and can be supported on a stand (442). In a preferred embodiment, the distance (d) between the turn-table (42,62) and the antenna receiver (44,64) of the testing set (40,60) is 3 or 10 meters (m).

With the arrangement of the second testing set (40), a test to be performed on a test device can be processed in a natural condition, and the result processed with the second testing set (40) is used to compare to that processed with the first testing set (60).

Furthermore, two wing plates (50) are respectively attached to opposed sides and at the top of the housing (10) and laterally extend respectively from the top of the housing (10). With the arrangement of the wing plates (50), the radiation emitted from the test device is cab be fully reflected by the wing plates (50) and received by the antenna receiver (44).

Figure 4:
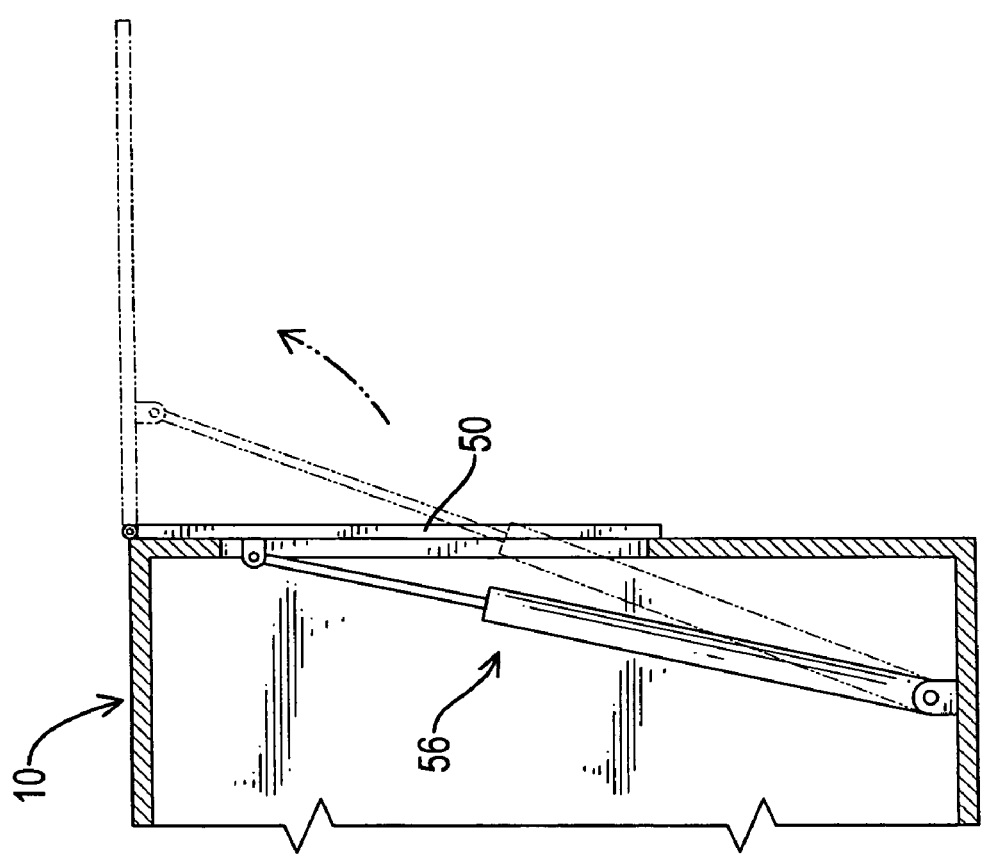
FIG. 4 is a side plan view in partial cross section of another embodiment of a foldable wing plates of a laboratory in accordance with the present invention.

In addition, the wing plates (50) can be foldable relative to the housing (10) when the wing plates (50) are not in use. In a first embodiment, the wing plates (50) are pivotally attached to the housing (10) with hinges (52), and two supporting arms (54) are attached to the housing (10) and the wing plates (50) to support the wing plates (50) at an erected position. In a second embodiment, with reference to FIG. 4, the wing plates (50) are pivotally attached to the housing (10), and two cylinders (56) are attached to the housing (10) and the wing plates (50) to support the wing plates (50) at the erected position. Accordingly, the wing plates (50) can be pivoted to be flush with the side of the housing when the wing plates (50) are at a folded position.

With reference to FIGS. 1 and 3, the housing (10) of the laboratory can be attached to a platform (72) of a container truck (70) with an electrical power generator (74). The power generator (74) is electrically connected to the testing apparatus (20), the air conditioner (22), the turn-table (42, 62) and the antenna receivers (44,64) of the testing sets (40,60) to provide electrical power to these devices. Accordingly, the laboratory can be conveniently moved to any desired location to process tests. Furthermore, a test can be processed at a mobile laboratory, such that the tested material can be tested at different conditions.

With such a mobile laboratory, multiple different tests can be processed, such as an Electromagnetic Interference Test (EMI Test) at 30 MHz to 1 GHz frequency, a Spurious Radiated Emission Test (SRE Test) at 1 GHz to 40 GHz frequency, a Spurious Conducted Emission Test (SCE Test) at 1 GHz to 40 GHz frequency, an Effective Radiated Power Test (ERP Test) at 30 MHz to 40 GHz frequency, a Power Density Test (PD Test) at 30 MHz to 40 GHz frequency, an Antenna Pattern Test (AP Test) at 30 MHZ to 40 GHZ frequency, a Radiated Susceptibility Test (RS Test) at 30 MHz to 3 GHz frequency, an Electrostatics Discharge Test (ESD Test), a Specific Absorption Rate Test (SAR Test) or an Electromagnetic Susceptibility Test (EMS Test). Therefore, the mobile laboratory in accordance with the present invention is versatile in use.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mobile electromagnetic compatibility (EMC) test laboratory comprising:
    a mobile housing having a top, an interior space and a shielding baffle inside the interior space to divide the interior space into a first room and a second room having a top, four sides and a bottom;
    a testing apparatus mounted inside the first room;
    a shielding unit mounted inside the second room;
    a first testing set mounted inside the second room and enclosed inside the shielding unit and comprising:
        a first table attached to the bottom of the second room to support a test device; and
        a first receiver separable from the first table and electrically connected to the testing apparatus in the first room; and
    a second testing set mounted outside the housing at a location corresponding to the first room and having:
        a second table attached to the top of the housing; and
        a second receiver separating from the second table and electrically connected to the testing apparatus in the first room.

2. The mobile laboratory as claimed in claim 1 further comprising an air conditioner mounted inside the first room.

3. The mobile laboratory as claimed in claim 2 further comprising an antenna tower attached to the top of the housing to support the receiver of the second testing set.

4. The mobile laboratory as claimed in claim 3 further comprising two wing plates attached to the top of the housing and laterally extending respectively from two opposed sides of the top of the housing.

5. The mobile laboratory as claimed in claim 4, wherein the wing plates are pivotally attached to the housing with hinges; and
    two supporting arms are attached to the housing and the wing plates to support the wing plates at an erected position.

6. The mobile laboratory as claimed in claim 4, wherein the wing plates are pivotally attached to the housing; and
    two cylinders are attached to the housing and the wing plates to support the wing plates at an erected position.

7. The mobile laboratory as claimed in claim 6, wherein the shielding unit is composed of multiple foam pyramids and multiple foam absorbers attached to the top, the sides and the bottom of the second room.

8. The mobile laboratory as claimed in claim 7 further comprising a window formed in the housing and corresponding to the second room; and
    a pipe attached to the window and connected to the air conditioner in the first room.

9. The mobile laboratory as claimed in claim 8 further comprising a stand attached to the bottom of the second room of the housing to support the receiver of the first testing set.

10. The mobile laboratory as claimed in claim 1 further comprising a stand attached to the top of the housing to support the second receiver of the second testing set.

11. The mobile laboratory as claimed in claim 10 further comprising two wing plates attached to the top of the housing and laterally extending respectively from two opposed sides of the top of the housing.

12. The mobile laboratory as claimed in claim 11, wherein the wing plates are pivotally attached to the housing with hinges; and two supporting arms are attached to the housing and the wing plates to support the wing plates at an erected position.

13. The mobile laboratory as claimed in claim 11, wherein the wing plates are pivotally attached to the housing; and
    two cylinders are attached to the housing and the wing plates to support the wing plates at an erected position.

14. The mobile laboratory as claimed in claim 1, wherein the shielding unit is composed of multiple foam pyramids of absorbers and ferrite tile attached to the top, the sides and the bottom of the second room.

15. The mobile laboratory as claimed in claim 1 further comprising an antenna tower attached to the bottom of the second room of the housing to support the first receiver of the first testing set.

16. A mobile electromagnetic compatibility (EMC) test laboratory comprising:
  a mobile housing having a top, an interior space and a shielding baffle inside the interior space to divide the interior space into a first room and a second room having a top, four sides and a bottom;
  a testing apparatus mounted inside the first room;
  a shielding unit mounted inside the second room;
  an air conditioner mounted inside the first room;
  a high frequency window formed in the housing and corresponding to the second room;
  a pipe attached to the window and connected to the air conditioner in the first room; and
  a first testing set mounted inside the second room and enclosed inside the shielding unit and comprising:
    a first table attached to the bottom of the second room to support a test device; and
    a first receiver separable from the first table and electrically connected to the testing apparatus in the first room.

* * * * *